(12) United States Patent
Long et al.

(10) Patent No.: US 6,784,016 B2
(45) Date of Patent: Aug. 31, 2004

(54) ORGANIC LIGHT-EMITTING DEVICES WITH BLOCKING AND TRANSPORT LAYERS

(75) Inventors: Ke Long, Princeton, NJ (US); James C. Sturm, Princeton, NJ (US); Min-Hao Michael Lu, Lawrenceville, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 10/176,496

(22) Filed: Jun. 21, 2002

(65) Prior Publication Data

US 2003/0020073 A1 Jan. 30, 2003

Related U.S. Application Data

(60) Provisional application No. 60/299,823, filed on Jun. 21, 2001.

(51) Int. Cl.$^7$ ............................................... H01L 51/60
(52) U.S. Cl. ......................... 438/99; 257/40; 257/103; 313/504
(58) Field of Search ......................... 257/40, 79, 103; 313/504, 506; 438/99

(56) References Cited

U.S. PATENT DOCUMENTS

| | | | | |
|---|---|---|---|---|
| 4,857,803 A | * | 8/1989 | Anderson, Sr. ............. | 313/509 |
| 5,276,381 A | * | 1/1994 | Wakimoto et al. .......... | 313/504 |
| 5,294,870 A | | 3/1994 | Tang et al. | |
| 5,405,709 A | * | 4/1995 | Littman et al. ............. | 428/690 |
| 5,703,436 A | | 12/1997 | Forrest et al. | |
| 5,869,199 A | * | 2/1999 | Kido .......................... | 428/690 |
| 6,087,196 A | | 7/2000 | Sturm et al. | |
| 6,097,147 A | | 8/2000 | Baldo et al. | |
| 6,303,238 B1 | | 10/2001 | Thompson et al. | |
| 6,337,102 B1 | | 1/2002 | Forrest et al. | |

OTHER PUBLICATIONS

P.I. Djurovich, et al., "Ir(III) Cyclometallated Complexes as Efficient Phosphorescent Emitters in Polymer Blend and Organic LEDs", Polymer Preprints 2000, 41(1), pp. 770–771.

M. Yang, et al., "Use of Poly(9–vinylcarbazole) as Host Material for Iridium Complexes in High–Efficiency Organic Light–Emitting Devices", Jpn. J. Appl. Phys., vol. 39 (2000), pp. L–828–L829, part 2, No. 8A, Aug. 1, 2000.

T.–F. Guo, et al., "Highly efficient electrophosphorescent polymer ligh–emitting devices", Organic Electronics 1, (2000), pp. 15–20.

S. Lamansky, et al., "Molecularly doped polymer light emitting diodes utilizing phosphorescent Pt(III) and Ir(II) dopants", Organic Electronics 2, (2001), pp. 53–62.

D.F. O'Brien, et al., "Electrophosphorescence from a doped polymer light emitting diode", Synthetic Metals 116, (2001), pp. 379–383.

(List continued on next page.)

*Primary Examiner*—Sara Crane
(74) *Attorney, Agent, or Firm*—Kenyon & Kenyon

(57) ABSTRACT

The present invention relates to an organic light emitting device (OLED) for producing electroluminescence having, in order, for example, an anode, a hole transporting layer (HTL), a blocking layer, an electron transporting layer (ETL), and a cathode. In the devices of the present invention, the hole transporting layer comprises a polymeric material, which material may be emissive or may be doped with an emissive dopant. The blocking layer and the electron transporting layer are small-molecule materials. The presence of a blocking layer confines the emission of light to the polymer layer, which may be a HTL or a separate emitting layer (EL). The devices of the present invention are suitable for use in single color, multi-color and full-color, passive or active matrix OLED displays.

30 Claims, 13 Drawing Sheets

OTHER PUBLICATIONS

S. Chang, et al., "Degradation mechanism of phosphorescent–dye–doped polymer light–emitting diodes", Applied Physics Letters, vol. 79, No. 13, pp. 2088–2090, Sep. 24, 2001.

C. Lee, et al., "Polymer phosphorescent light–emitting devices doped with tris(2–phenylpyridine) iridium as a triplet emitter", Applied Physics Letters, vol. 77, No. 15, pp. 2280–2282, Oct. 9, 2000.

R.W.T. Higgins, et al., "Energy transfer to porphyrin derivative dopants in polymer light–emitting diodes", Journal of Applied Physics, vol. 91, No. 1, pp. 99–105, Jan. 1, 2002.

W. Zhu, et al., "Highly efficient electrosphorescent devices based on conjugated polymers doped with iridium complexes", Applied Physics Letters, vol. 80, No. 12, pp. 2045–2047, Mar. 25, 2002.

F. Chen et al., "High–performance polymer light–emitting diodes doped with a red phosphorescent iridium complex", Applied Physics Letters, vol. 80, No. 13, pp. 2308–2310, Apr. 1, 2002.

J.P.J. Markham, et al., "High–efficiency green phosphorescence from spin–coated single–layer dendrimer light–emitting diodes", Applied Physics Letters, vol. 80, No. 15, pp. 2645–2647, Apr. 15, 2002.

X. Gong, et al., "High–Efficency Polymer–Based Electrophosporescent Devices", Advanced Materials, 14, No. 8, pp. 581–585, Apr. 18, 2002.

S. Lo, et al., "Green Phosphorescent Dendrimer for Light-Emitting Diodes", Adv. Mater 2002, 14, No. 13–14, pp. 975–979, Jul. 4, 2002.

X.–J. Wang, et al., "Electrophosphorescence in doped polythiophene light–emitting diodes".

H.W. Sands Corp., Specialty Chemicals for the World Wide Imaging Industry, OLED Polymeric Emitters, pp. 1–6; OLED Polymeric Emitters High Molecular Weight, pp. 1–3, from the H.W. Sands Corp. website www.hwsands.com, Jul. 30, 2002.

American Dye Source, Inc., Light Emitting Polymers, pp. 1–5, Mar. 25, 2002.

J.C. Sturm, et al., "Printing Approaches for Large–Area Color Organic LED Displays" Part of the SPIE Conference on Organic Light–Emitting Materials and Devices III, Denver Colorado, Jul. 1999, SPIE vol. 3797, pp. 266–274.

T.R. Hebner et al., "Ink–jet printing of doped polymers for organic light emitting devices", Appl. Phys. Lett., vol. 72, No. 5, pp. 519–521 (Feb. 2, 1998).

J. Bharathan et al., "Polymer electroluminescent devices processed by inkjet printing: I. Polymer light–emitting logo", Appl. Phys. Lett., vol. 72, No. 21, pp. 2660–2662 (May 25, 1998).

K. Tada, et al., "Three–Color Polymer Light–Emitting Devices Patterned by Maskless Dye Diffusion onto Prepatterened Electrode", Jpn. J. Appl. Phys., vol. 38, No. 10A, pp. L1143–L1145 (Oct. 1, 1999).

F. Pshenitzka, et al., "Three–color organic light–emitting diodes patterned by mased dye diffusion", Appl. Phys. Lett., vol. 74, No. 13, pp. 1913–1915 (May 29, 1999).

C. Adachi et al., "High–efficiency organic electrophosphorescent devices with tris(2–phenylpyridine)iridium doped into electron–transporting materials", Appl. Phys. Lett., vol. 77, No. 6, pp. 904–906 (Aug. 7, 2000).

M. Baldo et al., "Organic Vapor Phase Deposition," Advanced Materials, vol. 10, No. 18, pp. 1505–1514 (1998).

S. Shirai et al., "Fabrication of Multi Color Polymer EL Devices using the Photo–bleaching Method", Journal of Photopolymer Science and Technology, vol. 14, No. 2, pp. 317–322 (2001).

S. T. Lee et al., "21.3: A New Patterning Method for Full–Color Polymer Light–Emitting Devices: Laser Induced Thermal Imaging (LITI)", SID 2002 International Symposium, Digest of Technical papers, paper 21.3 pp. 784–787 (2002).

F. Pschenitzka, et al., "Patterned Dye Diffusion using transferred Photoresist for Polymer OLED Displays" Proc. SPIE, vol. 4105, pp. 59–68 (Jul. 31–Aug. 2, 2000).

F. Pschenitzka, et al., "Solvent–enhanced dye diffusion in polymer thin films for color turning of organic light–emitting diodes", Appl. Phys. Lett., vol. 78, No. 17, pp. 2584–2586 (Apr. 23, 2001).

Thompson et al., U.S. Patent Publishing No. US 2002/0034656 A1, Published Mar. 21, 2002.

Wakimoto et al., U.S. Patent Publication No. US 2001/0052751 A1, Published Dec. 20, 2001.

Wakimoto et al., U.S. Patent Publication No. US 2001/0043044 A1, Published Nov. 22, 2001.

Lamansky et al., U.S. patent application Ser. No. 09/978,455, filed Oct. 16, 2001, entitled "Organometallic Compounds and Emission–shifting Organic Electrophosphorescence".

* cited by examiner

EL Spectra of the RGB Tri-Layer Devices

I-V Characteristics with Different BCP Thicknesses

ORGANIC LIGHT-EMITTING DEVICES WITH BLOCKING AND TRANSPORT LAYERS

RELATED APPLICATIONS

This application claims the benefit of U.S. Provisional Application Serial No. 60/299,823 filed Jun. 21, 2001, the entire disclosure of which is expressly incorporated herein by reference.

STATEMENT OF GOVERNMENT INTERESTS

The present invention was made under Federal Contract Grant No. DARPA 341-4124, and the government may have certain rights to the subject invention.

FIELD OF THE INVENTION

The present invention relates to organic light-emitting devices ("OLEDs"), and more specifically, to multi-color organic light-emitting devices, having a polymeric hole transporting layer, and exciton blocking and electron transport layers comprising small-molecule materials to provide low leakage and high efficiency. The OLEDs of the present invention are suitable for use in single color, multi-color and full-color, passive or active matrix displays.

BACKGROUND OF THE INVENTION

Organic light-emitting devices (OLEDs) are a promising technology for next generation flat panel displays. OLEDs generally consists of small molecule or polymer layers disposed between an anode and a cathode. The polymer can by either self-emissive or doped with dye molecules. Upon application of an electric current, electrons and holes are injected from respective electrodes and recombine to form excitons that radiatively decay and emit light. The color of the light emission is determined by the energy levels of the emissive species. A functioning full-color OLED display requires the individual RGB pixels to emit the correct color, have low leakage current and have high yields. One of the major challenges in fabricating a full-color OLED display is the deposition of RGB OLED pixels on the same substrate, as conventional lithography processes employed in the semiconductor industry destroy the organic materials. Thermal vacuum deposition of small molecule materials through a shadow mask is the standard practice used in industry, but it suffers from poor material usage, low throughput, and cannot be easily scaled to large substrates. There are two promising patterning methods for polymer OLEDs that are particularly suited to high-speed, large-area manufacture: inkjet deposition of the emissive polymer or dopants and thermal dye transfer (T. R. Hebner and J. C. Sturm, *Appl. Phys. Lett.* 73 (13), 1913 (1999); T. R. Hebner et al., *Appl. Phys. Lett.* 72, 519 (1998); J. Bharathan et al., *Appl. Phys. Lett.* 72, 2660 (1998); K. Tada and M. Onoda, *Jpn. J. Appl. Phys.* 38, L1143 (1999); F. Pschenitzka and J. C. Sturm, *Appl. Phys. Lett.* 74 (13), 1913 (1999)). However, these pattern deposited polymer OLEDs suffers from low efficiency and high leakage current, due to the topology of the resultant films and the additional processing required. One reason for the low efficiency in these OLEDs is the high hole mobility in comparison to the electron mobility in the polymer layer. As a result, many holes traverse the entire device without recombining with an electron to form excitons. Or the excitons may be formed close to the metal cathode and quenched by the cathode before it can emit light.

A conventional OLED having a single polymer layer is shown in FIG. 1. A glass substrate 10 is first provided, forming the bottom layer of the device. Then, a transparent Indium Tin Oxide ("ITO") anode 15 is deposited on the glass substrate 10. An organic polymer layer 20 is deposited on the ITO anode 15, and a cathode 140 is deposited on polymer 20. As shown in FIG. 2a, the dye dopants can be selectively deposited on to the polymer 20 to produce sub-pixel elements, such as red, green, and blue light-emitting elements. Light generated by the device is emitted through the glass substrate 10 and anode 15, as indicated by the arrows A. Such devices, however, suffer from high current leakage and reduced efficiency. As shown in FIG. 2b, it is also known in the art to produce OLEDs consisting of a polymeric HTL 20 and a small-molecule ETL 35, typically Alq. However, to our knowledge, the light emission in all these devices is from Alq, which is green, thus separate RGB pixels cannot be achieved.

What would be advantageous, but has not yet been provided, is a multi-color OLED array having exciton blocking and electron transport layers to provide low leakage and high efficiency. It is accordingly an object of this invention to improve the efficiency and reduce the leakage current of OLEDs with pattern deposited polymer layers by depositing a small molecule blocking layer such as disclosed in U.S. patent application Pub. Nos. 2001/0,043,044 and 2001/0,052,751 on the polymer layer.

SUMMARY OF THE INVENTION

The present invention is directed toward combining the potential manufacturing features and advantages of pattern depositing polymeric materials together with being able to deposit one or more additional layers of a small molecule material over the polymeric layers so as to fabricate OLEDs having improved external quantum efficiencies. Such a method allows use of substantially any method know in the art for pattern depositing the emissive polymeric regions in a multicolor array of pixels. Furthermore, the polymeric layers of the OLED may use substantially any suitable combination of polymeric OLED structures known in the art, for example, an un-doped emissive polymer layer as the only polymer layer, a doped emissive polymer layer as the only polymer layer, an un-doped emissive polymer layer on top of a hole injection polymer layer, or a doped emissive polymer layer on top of the hole injection polymer layer.

The devices of the present invention are suitable for use in single color, multi-color and full-color, passive or active matrix OLED displays.

In one embodiment, the present invention provides full-color device comprising an array of RGB pixels. In this embodiment, the polymer layer is patterned with locally doped emissive dopants to provide discrete red, green and blue light-emitting subpixels.

In another embodiment, the invention provides a method of fabricating a display comprising an array of OLED structures, the method comprising the steps of preparing a substrate coated with an anode layer, depositing a polymeric layer over the anode layer, pattern depositing an array of emissive dopants onto the polymeric layer; depositing a blocking layer over the array of emissive dopants, depositing an electron transporting layer over the blocking layer, and depositing a cathode layer. The method of the invention may include the deposition of additional layers as provided herein.

The present invention also relates to a method of manufacturing a multi-color OLED having exciton blocking and electron transport layers. In one embodiment, a glass substrate is provided, on top of which an Indium-Tin Oxide (ITO) anode is deposited. An organic polymer layer is formed on the ITO anode, and emissive dopants are introduced into the organic layer to provide discrete, color-emitting regions capable of emitting various colors (i.e., red, green, and blue colors). These emissive dopants may be put down by ink jet printing in a single pass. A blocking layer is formed on the multi-color organic layer, on top of which an electron transport layer is deposited. Cathodes are then deposited on the electron transport layer to form a complete device.

It is an object of the present invention to provide a multi-color OLED array having exciton blocking and electron transport layers to provide a high-efficiency device having low leakage.

It is another object of the present invention to provide a multi-color OLED display having reduced reverse leakage current.

It is still another object of the present invention to provide a multi-color OLED display that prevents cathode-quenching of excitons generated by the OLED.

It is still another object of the present invention to provide a method of manufacturing a multi-color OLED display having blocking and electron transport layers.

BRIEF DESCRIPTION OF THE DRAWINGS

Other important objects and features of the invention will be apparent from the following Detailed Description of the Invention taken in connection with the accompanying drawings in which.

DETAILED DESCRIPTION OF THE INVENTION

Figure 1:
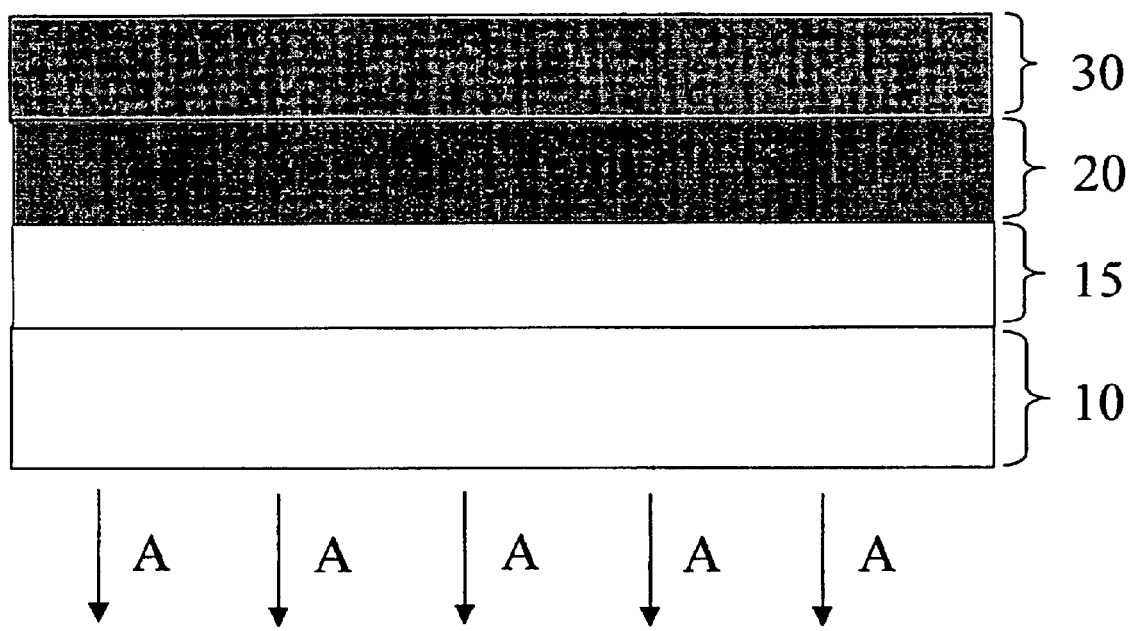
FIG. 1 is a cross-sectional view of a conventional multi-layer OLED.
Figure 2A:
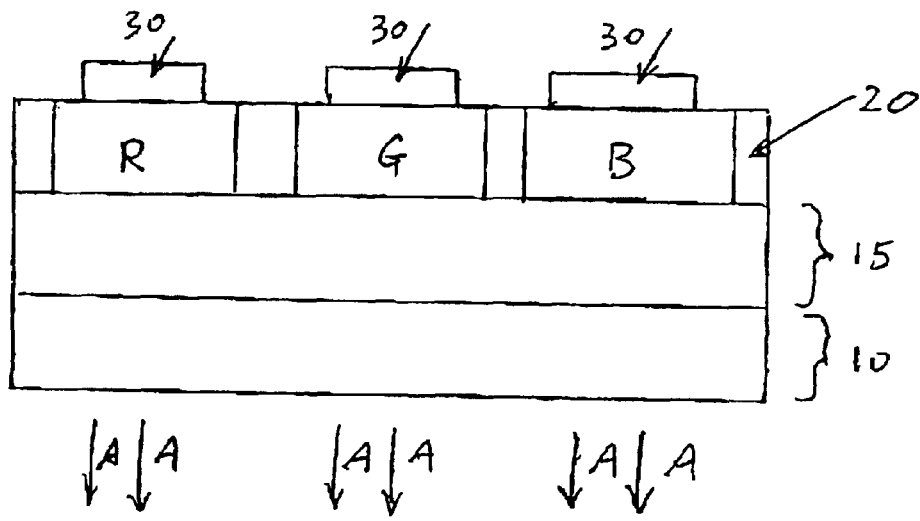
FIG. 2a is a cross-sectional view of RGB OLEDs comprised of selectively dye doped polymer layers.
Figure 2B:
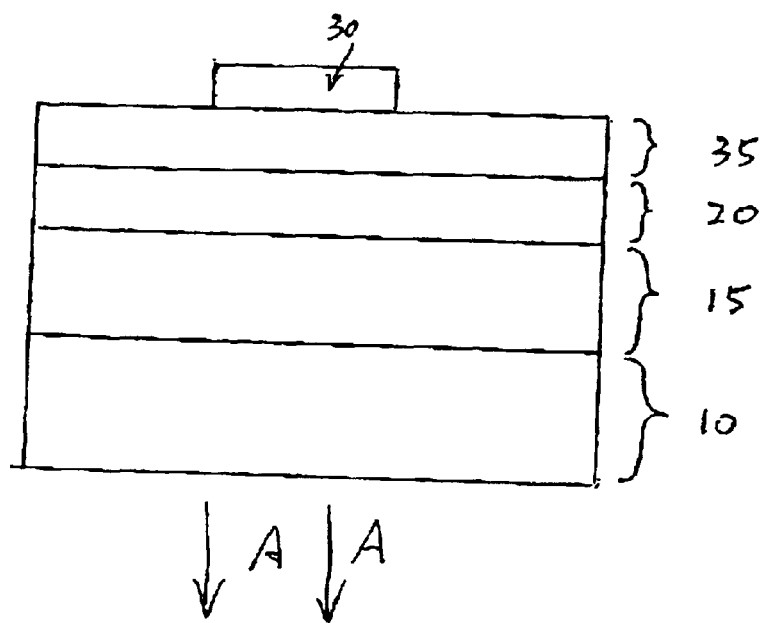
FIG. 2b is a cross-sectional view of an OLED with a polymer HTL and a small molecule ETL where substantially all the light is emitted from the ETL.

The present invention relates to an organic light emitting device for producing electroluminescence having, in order, an anode, a hole transport layer (HTL), a blocking layer (BL), and a cathode. Additional layers may be interposed between these layers, such as a hole injection layer (HIL), a cathode-smoothing layer, a separate emissive layer (EL), and an electron transport layer (ETL). In the devices of the present invention, the HIL, HTL and EL comprise a polymeric material, which material may be emissive or may be doped with an emissive dopant. The blocking layer and the electron transport layer are small-molecule materials. As used herein, the term "small-molecule material" contemplates materials composed of discreet molecules, as opposed to polymeric materials. The presence of a blocking layer confines the emission of light to the polymer layer, which may be a HTL or a separate EL. The devices of the present invention are suitable for use in single color, multi-color and full-color, passive or active matrix OLED displays.

Further, the present invention relates to multi-color OLED arrays having blocking and transport layers, and a method of manufacturing same. An electron transport layer and an blocking layer, both disposed between a polymer layer and a cathode, decrease leakage current, suppress hole tunneling, prevent cathode quenching of excitons generated in the polymer layer of the device, and confining light emission to the polymer layer. The device can be fabricated on a transparent glass substrate and ITO anode, and different emissive dopants can be doped into the polymer layer using techniques known in the art, such as masked dye diffusion or ink-jet printing, to form discrete, multi-colored subpixels.

The term "over" as used herein describes when one layer of the OLEDs of the present invention is deposited above another layer of the OLED. The term "over" allows for one or more optional layers to be deposited between the layers. That is, the layers may be adjacent or one or more optional layers may be situated between the layers.

In one embodiment, the present invention provides an OLED having, in order, a substrate, an anode, a polymer layer, a blocking layer, an electron transporting layer, and a cathode wherein, the polymer layer is a hole transporting layer, the blocking layer is a small molecule material, the electron transporting layer is a small molecule material, and substantially all light emission comes from the hole transporting layer. Additional layers may be interposed between these layers.

In another embodiment, the present invention provides an OLED having, in order, a substrate, an anode, a first polymer layer, a second polymer layer, a blocking layer, an electron transporting layer; and a cathode wherein, the first polymer layer is a a hole injection layer, the second polymer layer is an emissive layer, the blocking layer is a small molecule material, the electron transporting layer is a small molecule material, and substantially all light emission comes from the emissive layer. Additional layers may be interposed between these layers. The polymeric emissive layer may or may not be a hole transporting layer.

Substrates according to the present invention are substantially transparent, and may be rigid or flexible. The device is typically manufactured upon a substrate such as glass, quartz, sapphire or plastic. The substrate may be, for example, rigid, flexible, conformable, and/or shaped to a desired configuration.

The emissive polymer layer may be a single luminescent (un-doped) polymer layer such as PPV; or an emissive doped-polymer layer, such as PVK doped with an emissive dopant. In a preferred embodiment, the polymer layer is additionally doped with an electron transport dopant. The electron transport dopant is a material that, when doped into the polymer layer, allows for greater electron mobility in the polymer layer. A preferred electron transport dopant is 2-(4-biphenylyl)-5-(4-tert-butyl-phenyl)-1,3,4-oxidiazole (PBD).

In one embodiment, the emissive material(s) are added as a free molecule, i.e. not bound to the polymer, but dissolved in a polymer "solvent". In an alternative embodiment, the emitter is part of the repeating unit of the polymer, for example Dow's polyfluorene materials. Both fluorescent and phosphorescent emitters may be appended to polymer chains and used to make the OLEDs of the present invention.

In another embodiment of the invention, rather than using a single polymer layer, there may also be a polymeric hole injection layer (HIL), e.g., PEDOT:PSS, deposited over the anode layer, wherein the emissive polymer layer is then deposited over the HIL.

The emission colors from the polymer layer can be controlled by adding a small amount of emissive dopant into the polymer film. The emissive dopant, or dye, may emit via fluorescence (from singlet excited states) or via phosphorescence (from triplet excited states). The fluorescent materials may be selected from those known in the art, such as those disclosed in U.S. Pat. Nos. 5,703,436 or 5,294,870, which are incorporated herein by reference. The phosphorescent materials may be selected from those known in the art, such as those disclosed in U.S. Pat. No. 6,303,238 and in U.S. application Nos. 2002/0034656 or U.S. Ser. No. 09/978455, each of which is incorporated herein by reference.

An advantage of phosphorescence is that all of the excitons, which are formed either as a singlet or triplet excited state, may participate in luminescence. The phosphorescent materials for use in the present invention are typically organo-metallic compounds. The organo-metallic phosphorescent materials may be selected from those taught in applications U.S. Ser. No. 08/980,986, filed Jun. 18, 2001 and U.S. Ser. No. 09/978455, filed Oct. 16, 2001, each of which is incorporated herein in its entirety by reference.

A blocking layer comprising a small-molecule material is deposited as a continuous layer over the polymeric layer. The blocking layer is used to confine the light emission to the polymeric layer, thus preventing color contamination caused by emission from the ETL material. Blocking layers may be used to prevent excitons and/or holes from leaving the polymer layer.

In one embodiment the blocking layer is a hole blocking layer. Such a material have a low enough highest occupied molecular orbital (HOMO) to block the holes from entering the ETL layer, but at the same time the material have a low enough electron barrier to allow electrons to pass through and enter the polymer layer. Suitable materials for use as a hole blocking layer have a HOMO energy level that is higher than that of the polymer layer at the interface between the hole blocking layer and the polymer layer. A greater difference in HOMO energy levels results in better hole blocking properties.

In another embodiment of the invention, the blocking layer is an exciton blocking layer. Such a material blocks exciton diffusion into the ETL, such as disclosed in U.S. Pat. No. 6,097,147, which is incorporated herein in its entirety by reference. Exciton blocking materials will generally have a larger band gap (the difference between the HOMO and lowest unoccupied molecular orbital (LUMO) energy levels) than the adjacent polymer material. Accordingly, excitons generally may not diffuse from a material having a lower band gap into a material having a higher band gap, and a higher band gap material may be used to block excitons from leaving a lower band gap material. Such an exciton blocking layer confines electrically-generated excitons within the polymer layer.

In a further embodiment of the invention, the material selected for the blocking layer may have both hole blocking and exciton blocking properties. A preferred material for use in the blocking layer is 2,9-dimethyl-4,7-diphenyl-1,10-phenanthroline (BCP).

A small-molecule electron transporting material is deposited as a single layer over the blocking layer. The ETL material may be selected from the small molecule ETL materials known in the art. The ETL materials may include, in particular, an aryl-substituted oxadiazole, an aryl-substituted triazole, an aryl-substituted phenanthroline, a benzoxazoles or a benzthiazole compound, for example, 1,3-bis(N,N-t-butyl-phenyl)-1,3,4-oxadiazole ("OXD-7"); 3-phenyl-4-(1'-naphthyl)-5-phenyl-1,2,4-triazole ("TAZ"); 2,9-dimethyl-4,7-diphenyl-phenanthroline ("BCP"); bis(2-(2-hydroxyphenyl)-benzoxazolate)zinc; or bis(2-(2-hydroxyphenyl)-benzthiazolate)zinc; such as disclosed in C. Adachi et al., *Appl. Phys. Lett.*, vol. 77, 904 (2000). Other electron transporting materials include (4-biphenyl)(4-tertbutylphenyl)oxidiazole (PDB) and aluminum tris(8-hydroxyquinolate) (Alq).

Suitable anode materials may include conductive materials such as a metal, a metal alloy or an electrically conductive oxide such as ITO, which are connected to electrical contacts. The anode preferably comprises a transparent electrically conductive oxide, such as indium tin oxide (ITO), zinc indium tin oxide, or the like.

The cathode is preferably a low work function, electron-injecting material, such as a metal layer. A cathode, such as LiF/Al or Mg:Ag, may also be used. The latter may be used as a compound cathode in combination with ITO.

In another embodiments of the invention, a polymeric hole injection layer (HIL) may be present between the anode layer and the polymeric hole transporting layer, or between the anode layer and an emissive layer. The hole injecting materials of the present invention may be characterized as materials that planarize or wet the anode surface so as to provide efficient hole injection from the anode into the hole injecting material. The hole injecting materials of the present invention are generally characterized as having a HOMO energy level that favorably matches up with the adjacent anode layer on one side of the HIL layer and the HTL or emissive layer on the opposite side of the HIL. Thus, preferred properties for the HIL material are such that holes can be efficiently injected from the anode into the HIL material.

The HIL materials, while still being hole transporting materials, are generally distinguished from conventional hole transporting materials that are typically used in the hole transporting layer of an OLED in that such HIL materials have a hole mobility that may be substantially less than the hole mobility of conventional hole transporting materials. Preferred HIL materials include polymeric materials such as poly-3,4-ethylenedioxythiophene ("PEDOT") or poly (ethene-dioxythiophene):poly(styrene sulphonic acid) (PEDOT:PSS), which are effective in promoting injection of holes from the anode into the HIL material and subsequently into the HTL or EL. Polyanaline (PANI) may also be used as the HIL material.

The polymer layers is used may be deposited using those methods known in the art. A preferred method of polymer deposition is by spin coating the polymer using an appropriate solvent.

The small-molecule materials may be vacuum deposited using the techniques known in the art. For example, a representative method of depositing the small-molecule material layers is by thermal evaporation or organic vapor phase deposition (OVPD) such as disclosed in Baldo et al., "Organic Vapor Phase Deposition," *Advanced Materials*, vol. 10, no. 18 (1998) pp. 1505–1514 and application Ser. No. 08/972,156, filed Nov. 17, 1997 and entitled "Low Pressure Vapor Phase Deposition Of Organic Thin Films", which are incorporated herein by reference.

In one embodiment, the present invention provides a full-color OLED display comprising an array of RGB pixels. In this embodiment, the polymer layer is patterned with locally doped emissive dopants to provide discrete red, green and blue light-emitting subpixels.

In one embodiment of the invention, multiple emissive materials are applied to a previously deposited polymer film to give, for example, red-green-blue (RGB) subpixels. Thus, the present invention provides for full-color OLED displays using an array of the multiple color pixels as described herein. For full-color displays, subpixels emitting red, green and blue (RGB) colors are fabricated side by side on the polymer layer. Therefore, patterning the polymer layer to achieve RGB colors is important in achieving a full color display.

The emission colors from the subpixels can be controlled by introducing an emissive dopant into the polymer film. There are several methods to achieve the subpixel patterning based on this principle, for example ink-jet printing of a solution of the emissive dopant on a previously spin-coated polymer film (see T. R. Hebner and J. C. Sturm, *Appl. Phys. Lett.* 73 (13), 1913 (1999); T. R. Hebner et al., *Appl. Phys. Lett.* 72, 519 (1998); and J. Bharathan et al., *Appl. Phys. Lett.* 72, 2660 (1998)), photobleaching of a dye (see J. Kido et al., *Journal of Photopolymer Science and Technology*, 14, 317 (2001)), patterned dye transfer by local heating (see K. Tada and M. Onoda, *Jpn. J. Appl. Phys.* 38, L1143 (1999)), thermal transfer through a mask (see F. Pschenitzka and J. C. Sturm, *Appl. Phys. Lett.* 74 (13), 1913 (1999)), and laser induced thermal transfer (see S. T. Lee et al., SID 2002 International Symposium, Digest of Technical papers, paper 21.3 (2002)), each is incorporated herein by reference.

In another embodiment, the emissive dopants are patterned onto the polymer layer using a stamping technique to transfer the emissive dopant from a source to the polymer layer of the device. The printing plate comprises a pre-patterned source layer containing the emissive dopant(s) on a substrate (i.e. glass, plastic, etc.). The source may be a polymer, such as Vylon 103, to which the emissive dopants have been added. The printing plate may be patterned by laminating a pre-patterned soft masking layer to the source layer, dry etching, followed by removal of the masking layer (see F. Pschenitzka and J. C. Sturm, *Proc. SPIE* 59, 4105 (2000)). The printing plate is aligned to and brought into contact with the polymer layer of the device to transfer the emissive dopants from the source layer onto the device polymer. In one embodiment, each of the emissive dopants forming a subpixel are transferred in an independent stamping process.

After the emissive dopant is applied to the polymer layer, an additional step may be advantageously employed to assist the diffusion of the emissive dopant into the polymer layer. (see F. Pschenitzka and J. C. Sturm, *Appl. Phys. Lett.* 78 (17), 1913 (2001)). In one embodiment, the emissive dopant (s) may be distributed into the polymer film by exposure to an organic solvent vapor.

In another embodiment of the present invention, separate polymers or polymer blends may be deposited side-by-side to form the RGB subpixels. In one embodiment, the polymers themselves may be emissive (e.g., PPV, etc.) and so are used without the addition of an emissive dopant. Alternatively, a fluorescent or phosphorescent emitter may be appended to the polymer chains or may be part of the repeating unit of the polymer, for example Dow's polyfluorene materials. In another embodiment, separate solutions comprising a polymer and an emissive dopant are deposited side-by-side. In each case, a separate polymer solution is used for each colored subpixel. The polymers or polymer blends are deposited side-by-side by printing of the polymer solutions (see T. R. Hebner et al., *Appl. Phys. Lett.* 72, 519 (1998)).

Following the deposition of the array of pixels, a blanket layer of a small-molecule blocking layer is deposited. A blanket layer of a small molecule ETL is deposited over the blocking layer. The cathodes may be deposited used methods known in the art. For top emission devices, transparent cathodes, such as disclosed in U.S. Pat. No. 5,703,43, may be employed.

Figure 3A:
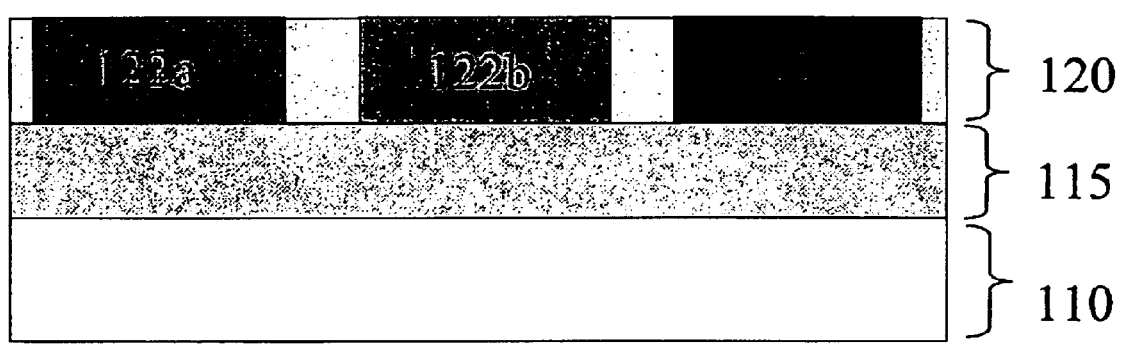
FIGS. 3a–3d are cross-sectional views showing fabrication steps for producing a multi-color OLED array according to present invention having exciton blocking and electron transport layers.

Embodiments of the present invention will now be described with reference to the drawings. It is understood that these embodiments are intended as illustrative examples of the invention, and do not limit the invention FIG. 3a is a cross-sectional view showing initial fabrication steps of the multi-layer OLED of the present invention. Transparent substrate 110 forms the base layer of the device. In a preferred embodiment of the present invention, substrate 110 is made of a 1.1 mm thick layer of transparent glass, but could be formed of other materials and dimensions known in the art.

Transparent anode 115 is deposited on substrate 110, and provides a first electric connection for the OLED. Preferably, anode 115 is made of ITO and has a thickness of about 80 nm, but other materials and dimensions known in the art can be employed. Deposited on top of anode 115 is organic polymer layer 120. Organic polymer layer 120 is a hole transport and exciton emitting polymer layer, preferably formed of a 100 run thick polymer blend comprising poly(9-vinylcarbazole) ("PVK") as a hole transport polymer, 2-(4-biphenylyl)-5-(4-tert-butyl-phenyl)-1,3,4-oxidiazole ("PBD") as an electron transport molecule, and one or more emissive dopants. It is to be understood that other materials and dimensions, as is known in the art, can be used to form organic polymer layer 120.

Emissive dopants 122a–122c can be introduced into organic polymer layer 120 to form discrete, sub-pixel regions capable of producing light of various colors, such as red, blue, and green. The emissive dopants 122a–122c can be added to organic polymer layer 120 by ink-jet printing, masked dye diffusion, or other methods known in the art. A methodology for ink-jet printing of emissive dopants can be found in U.S. Pat. No. 6,087,196 to Sturm, et al., the entire disclosure of which is incorporated herein by reference. In a preferred embodiment of the present invention, fluorescent emissive dopants of nile red, Coumarin 6, and Bimane are added to organic polymer layer 120 to form separate red, green, and blue light-emitting regions. Other colors and/or emissive dopants known in the art or hereinafter developed can be employed and are considered within the scope of the invention. Importantly, these multiple emissive dopants can be put down by ink jet printing in a single pass to form a multi-color array having red, green and blue subpixels.

Figure 3B:
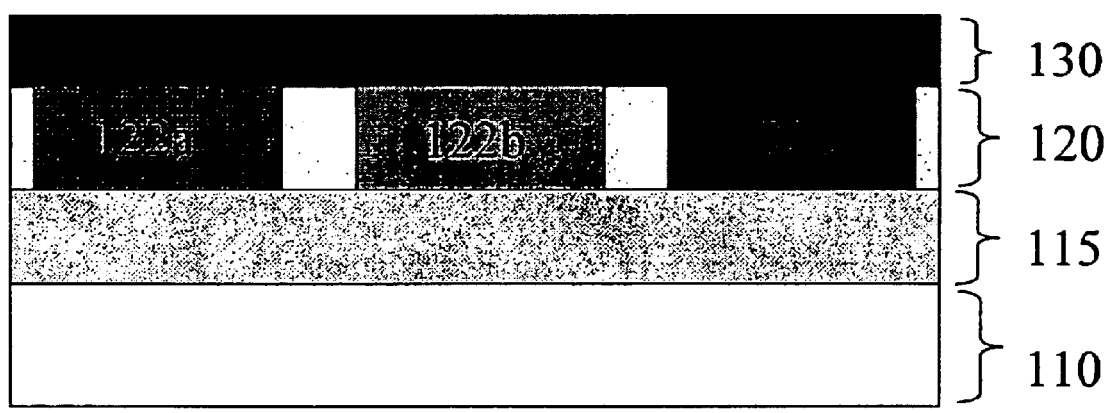

FIG. 3b shows additional fabrication steps of the present invention. After the dyes 122a–122c have been introduced into organic layer 120, blocking layer 130 is deposited onto organic polymer layer 120. Importantly, blocking layer 130 confines excitons to organic polymer layer 120, yet allows electrons to pass through. This configuration ensures that emissive dopants 122a–122c of organic polymer layer 120 control the emission colors of the OLED. Without blocking layer 130, excitons generated in organic polymer layer 120 can migrate away from layer 120, causing the OLED to suffer distortion of colors emitted thereby. In a preferred embodiment of the present invention, blocking layer 130 is a 6 nm thick layer of 2,9-dimethyl-4,7-diphenyl-1,10-phenanthroline (BCP), but other materials and dimensions are considered within the scope of the invention. Blocking layer 130 has a sufficiently low electron barrier to allow electrons to pass through it and into organic polymer layer 120. Further, blocking layer 130 has a sufficiently low HOMO characteristic to block holes from entering layers above it (i.e., electron transport layer 135, described in greater detail below).

Figure 3C:
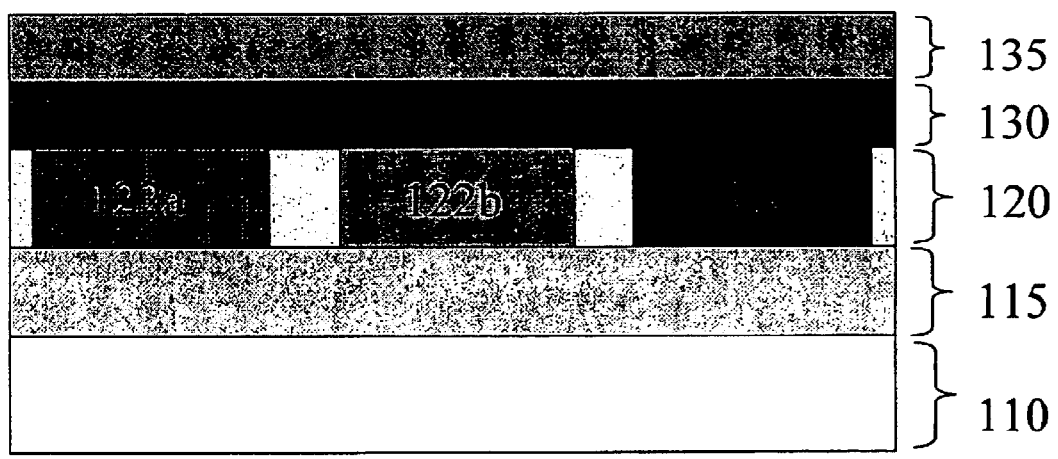

FIG. 3c shows further fabrication steps of the present invention. Electron transport layer 135 is deposited on blocking layer 130 to reduce reverse leakage current of the OLED and to move cathodes of the OLED away from the organic polymer layer 120, which operates as both a hole transport and emitting layer. By moving the cathodes away from organic polymer layer 120, electron transport layer 135 reduces cathode-quenching effects of excitons via dipole-metal interaction, and balances electron and hole transport to increase efficiency of the OLED. In a preferred embodiment of the present invention, electron transport layer 135 is a 40 nm thick layer of tris-8-hydroxyquinoline aluminum (Alq). However, other materials and dimensions can be employed in accordance with the present invention. Electron transport layer 135 can be deposited on blocking layer 130 using continuous thermal evaporation, or other deposition techniques known in the art.

Figure 3D:
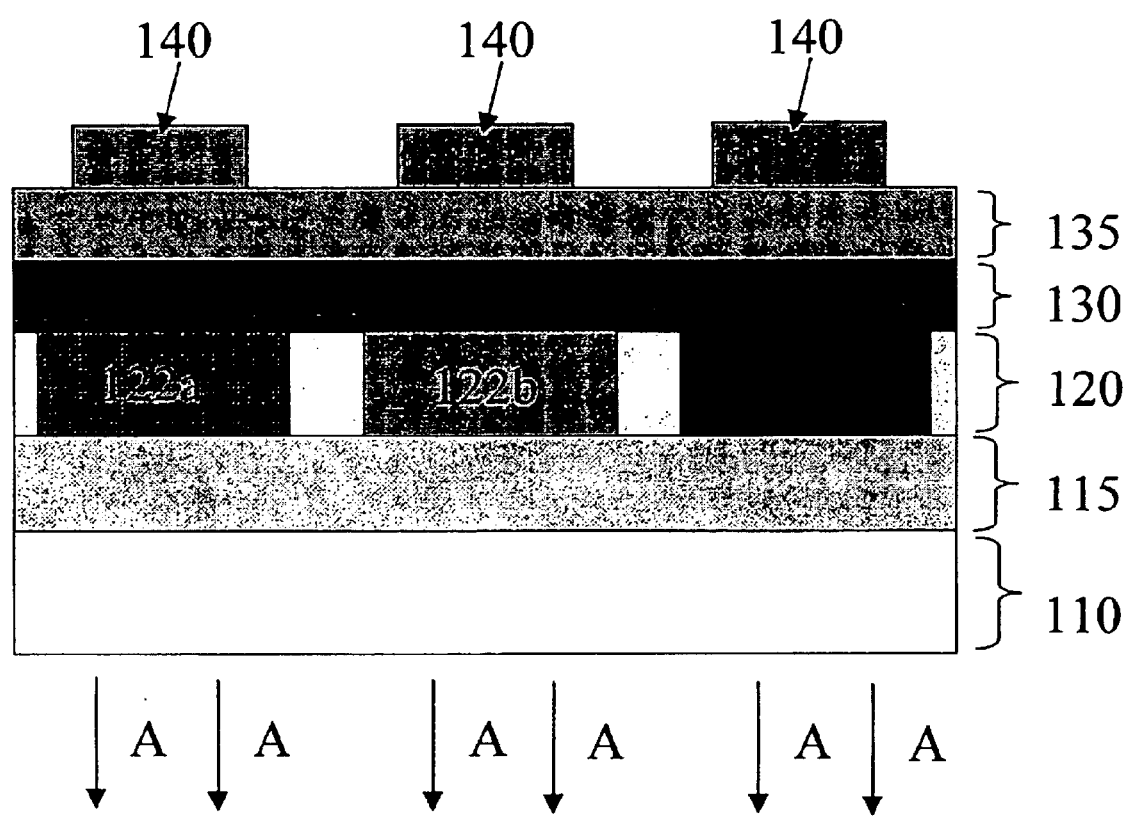

Finally, as shown in FIG. 3d, cathodes 140 are deposited on transport layer 135. Cathodes 140 are preferably 150 nm thick, and are formed of 50 nm Mg:Ag(10:1)/100 nm Ag, but other materials and other dimensions, as known in the art, are considered within the scope of the invention. The completely fabricated OLED generates light in organic polymer hole transport and emitting layer 120, and transmits light through layers 110 and 115, in the general direction indicated by the arrows A. Importantly, the blocking layer 130 and transport layer 135 ensure that light emission is confined to organic layer 120, and more particularly, to doped regions 122a–122c to provide multiple colors.

Figure 4A:
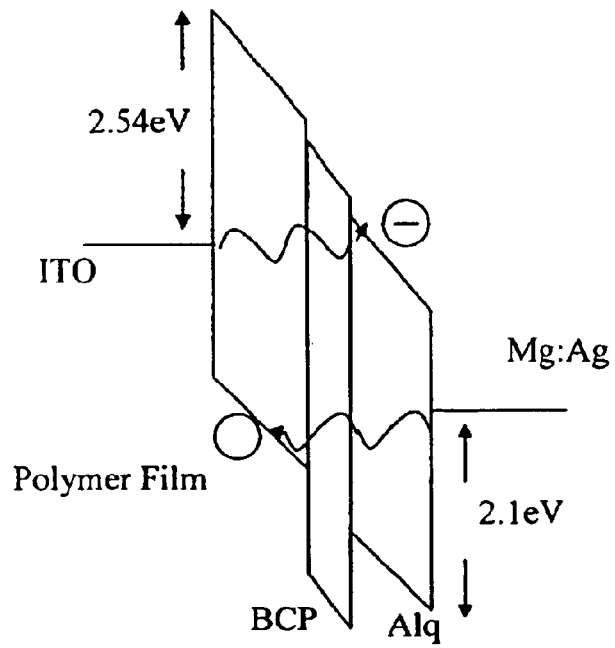
FIGS. 4a–4b are band diagrams comparing a multi-color OLED of the present invention to conventional OLEDs.
Figure 4B:
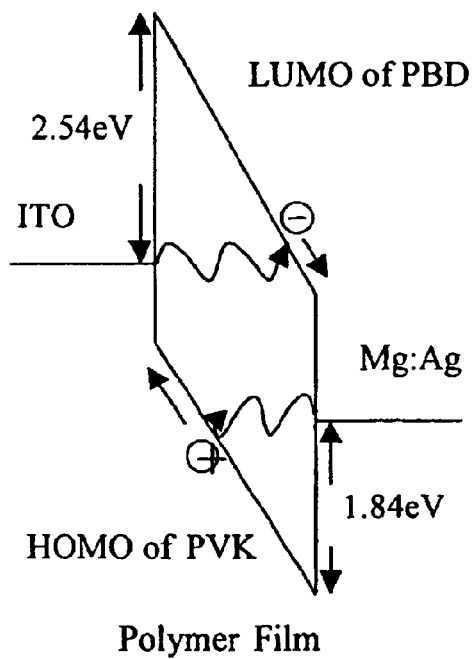

FIGS. 4a–4b are band diagrams comparing an OLED of the present invention to conventional OLEDs that do not have electron transport or blocking layers. The diagrams show leakage currents of both devices due to hole and electron tunneling. FIG. 4a is a reverse-biased band diagram of an OLED of the present invention. FIG. 4b is a reverse-biased band diagram of a conventional OLED not having electron transport or blocking layers. As can be seen from the diagrams, the presence of the blocking layer 130 and transport layer 135 of the present invention increase hole tunneling barrier from 1.84 eV to 2.1 eV, thereby drastically suppressing reverse leakage current of the device and providing increased efficiency.

Figure 5:
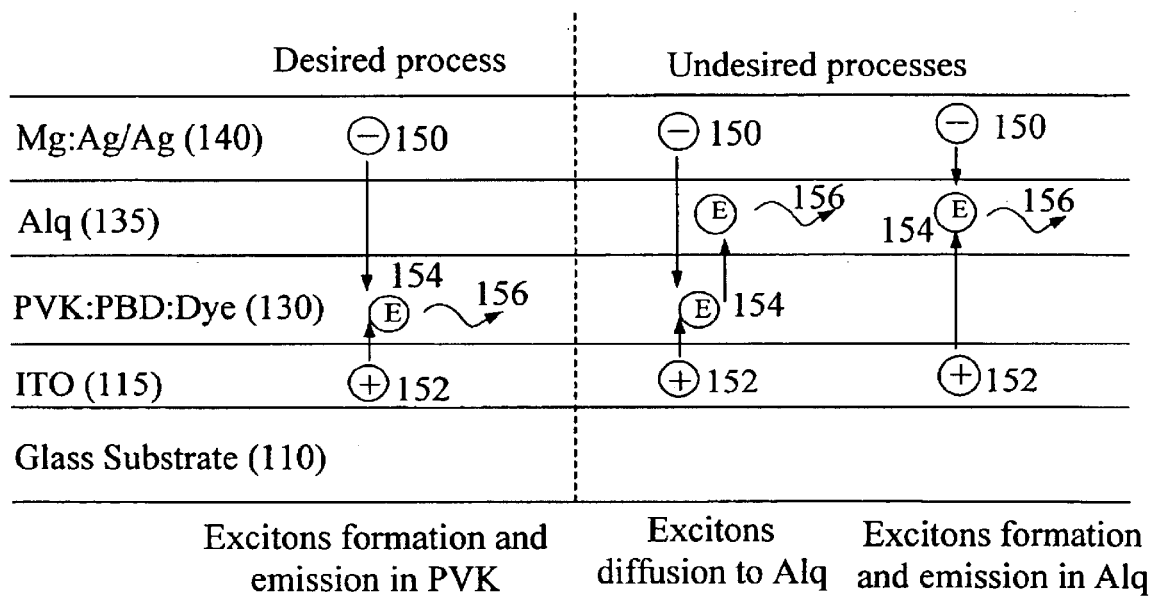
FIG. 5 is a diagram showing exciton formation and emission properties of an OLED of the present invention.

FIG. 5 is a diagram showing exciton formation and emission properties of an OLED of the present invention. Glass substrate 110, as mentioned earlier, forms the base layer of the OLED, on top of which ITO anode 115, organic polymer layer 120, blocking layer 130, electron transport layer 135, and cathode 140 are deposited. During operation of the OLED, an electron 150 injected by cathode 140 moves through layers 135 and 130 of the device, and into organic polymer layer 120. Simultaneously, a hole 152 injected by anode 115 moves into organic polymer layer 120. When the electron 150 and hole 152 meet in organic layer 120, an exciton 154 is formed, emitting visible radiation 156 by recombination in polymer layer 120. Emissive dopants in organic polymer layer 120 control the colors of the visible radiation 156 to produce light of varying colors (i.e., red, green, and blue to form a multi-color display).

Importantly, blocking layer 130 prevents exciton 154 from moving into layers of the device other than organic polymer layer 120. Further, the low HOMO (Highest Occupied Molecular Orbital) of the blocking layer 130 prevent holes from reaching layer 130 or 135. This ensures that no excitons are formed in layers 130 or 135, so that emissive dopants in layer 120 control the emission color. Further, because no excitons are formed in or reach layer 135, the possibility of cathode quenching of the excitons is eliminated, thereby increasing efficiency of the OLED. Additionally, electron transport layer 135 suppresses hole tunneling to reduce reverse leakage current. Visible radiation 156, once formed, is visible through anode 115 and substrate 110, thereby allowing the OLED to efficiently generate and emit multicolor light.

Figure 6:
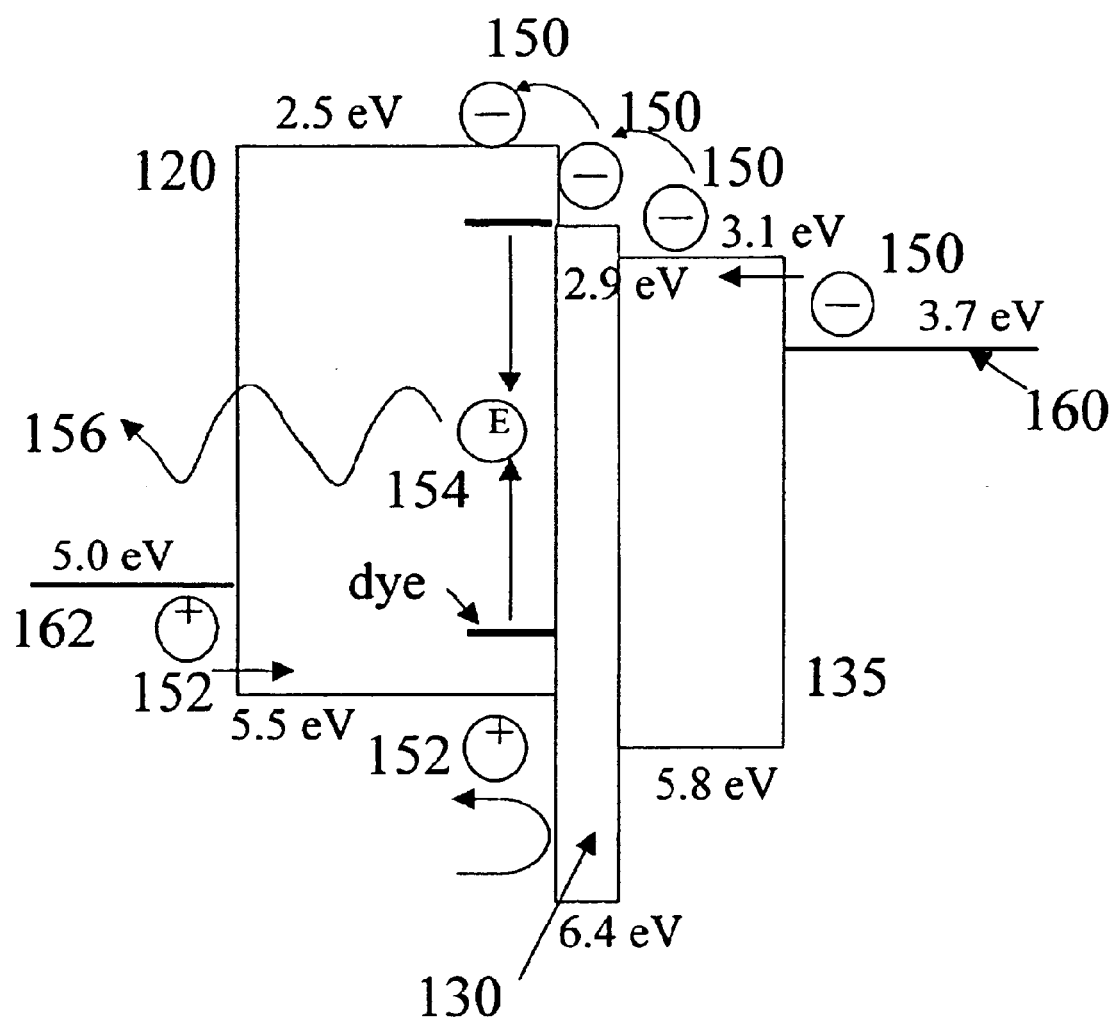
FIG. 6 is a diagram showing exciton formation, emission properties, and sample energy levels of an OLED of the present invention.

FIG. 6 is a diagram showing exciton formation, emission properties, and sample energy levels of an OLED of the present invention. As can be seen in the diagram, electron 150 and hole 152 each experience varying energy levels as they travel toward organic polymer layer 120. For example, when initially introduced from electron source 160 (i.e., the cathode of the OLED), electron 150 initially has an energy level which is 3.7 eV lower than the vacuum level for an Mg:Ag cathode. As the electron 150 migrates through electron transport layer 135 and blocking layer 130, the energy levels are reduced to 3.1 eV and 2.9 eV below the vacuum level, respectively. When electron 150 ultimately enters organic polymer layer 120, it has an energy level of approximately 2.5 eV below the vacuum level.

When hole 152 is introduced via hole source 162 (i.e., the anode of the OLED), hole 152 initially occupies an energy level which is 5.0 eV below the vacuum level (electron energy). Upon entering polymer layer 120, the energy difference is increased to 5.5 eV. When both electron 150 and hole 152 are present in polymer layer 120, exciton 154 is formed in the doped region 122 of organic polymer layer 120, resulting in the emission of visible radiation 156 through recombination. Importantly, the doped region 122 controls the color of the visible radiation 156. Blocking layer 130 and electron transport layer 135 ensure that exciton 154 remains in organic polymer layer 120, to prevent cathode-quenching and hole tunneling.

FIGS. 7a–7d are graphs showing optical and electrical properties of the multi-layer OLED of the present invention.

Figure 7A:
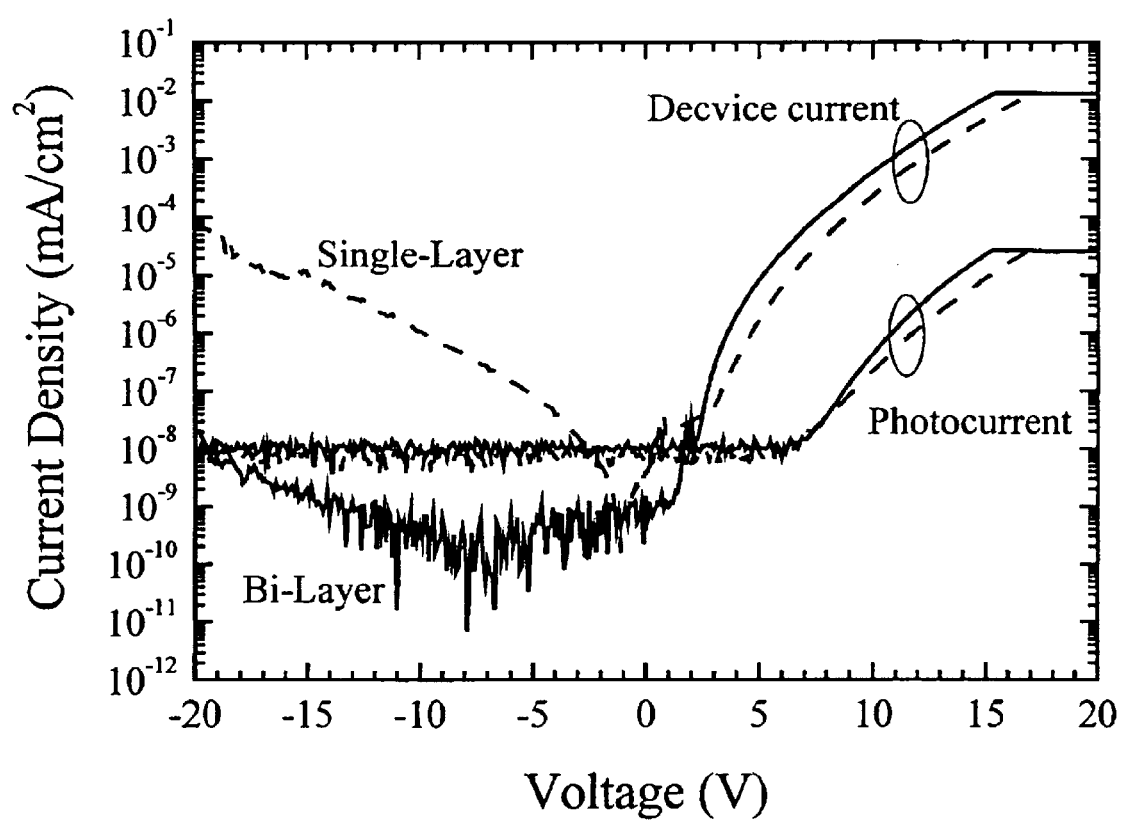
FIGS. 7a–7d are graphs showing optical and electrical properties of OLEDs of the present invention.

FIG. 7a shows OLED current density, detected photocurrent density, and voltage characteristics of OLEDs with and without the electron transport layer of the present invention. As can be seen, the OLED with the electron transport layer has a much lower leakage current in reverse-bias mode, compared to an OLED without the electron transport layer. Further, the addition of the electron transport layer does not increase the operation voltage of the OLED. Thus, the presence of the electron transport layer suppresses leakage current without increasing operating voltage of the OLED.

Figure 7B:
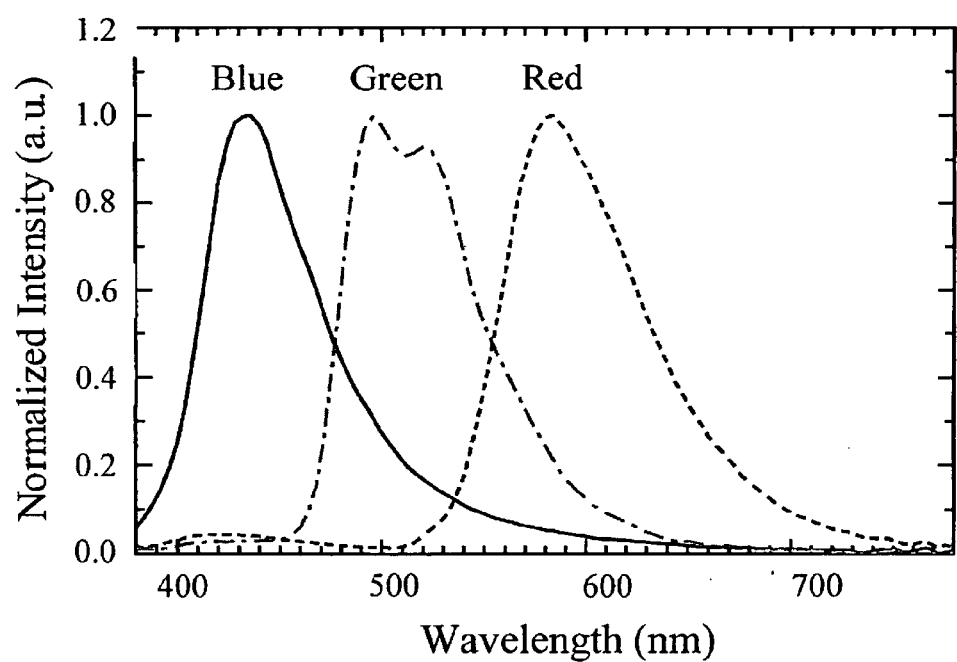

In FIG. 7b, electroluminescent spectra of an OLED according to the present invention (having three different emissive dopants; i.e., blue, green, and red) are shown. Normalized intensities are measured in arbitrary units (a.u.), and plotted against wavelengths for blue, green, and red colors emitted by the OLED. Blue, green, and red colors having peak wavelengths of 436 nm, 500 nm, and 590 nm, respectively, are emitted by the device. Such a device can be formed by adding the emissive dopants Bimane (blue), Coumarin 6 (green), and Nile red, respectively, to the polymer layer 120 of the present invention.

Figure 7C:
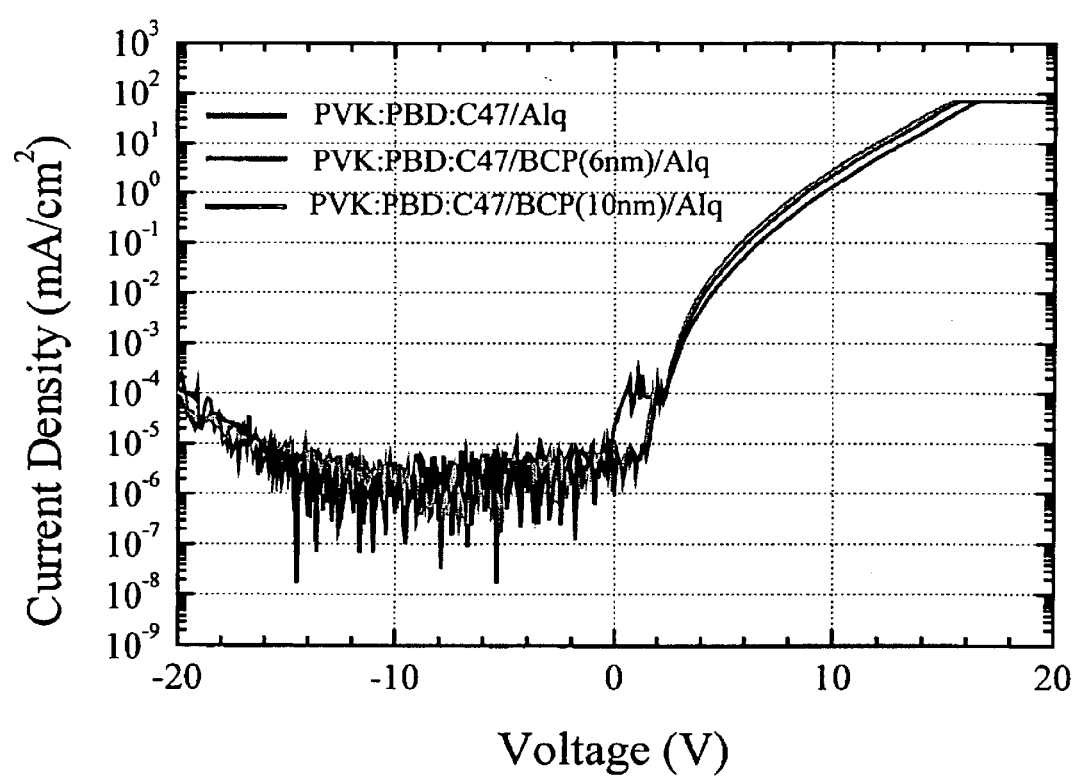

FIG. 7c shows current density (I) and voltage (V) characteristics of OLEDs manufactured with blocking layers (BCP) of varying thicknesses. As can be seen, different thicknesses of the BCP layer do not give rise to appreciable increases in operating voltages of the OLEDs. Thus, the presence of the BCP layer increases optical efficiency of the OLED without adversely affecting operating voltages.

Figure 7D:
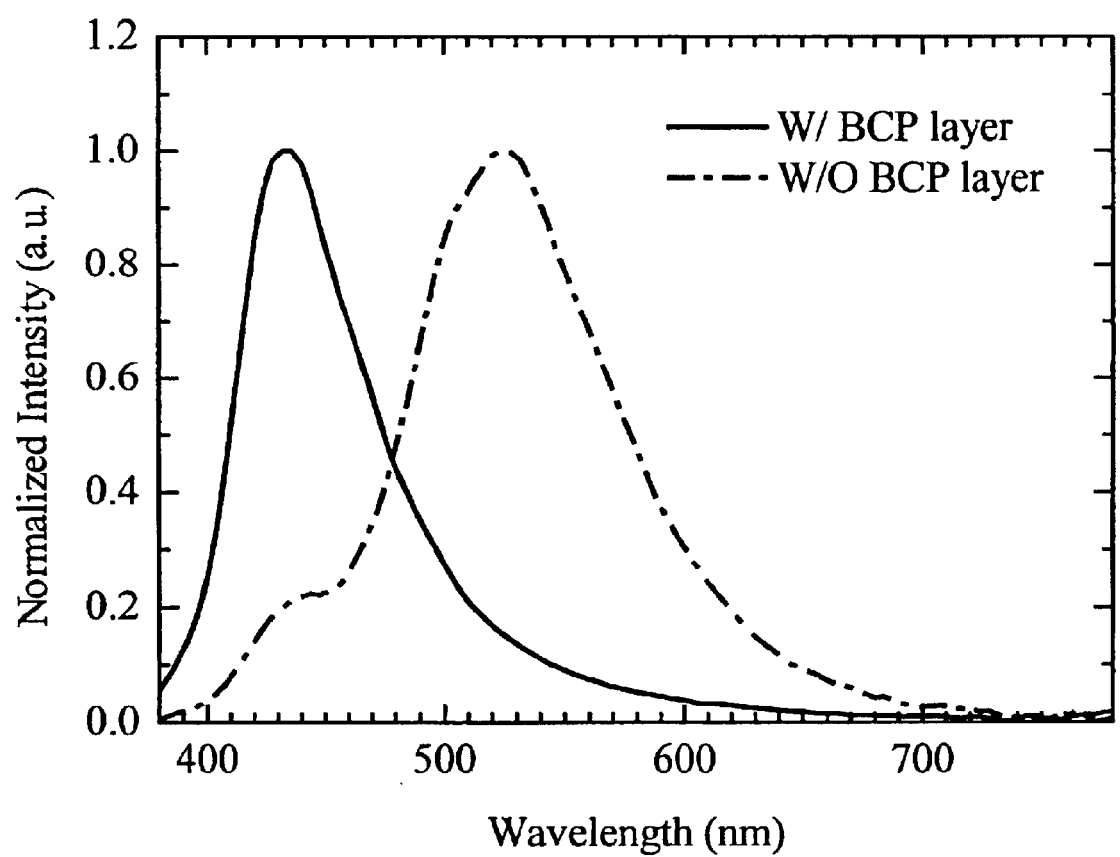

FIG. 7d is a graph showing electroluminescence spectra of an OLED of the present invention, illustrating the effect of the blocking (BCP) layer on emission characteristics. The OLED has at least one emissive dopant (Bimane) in the polymer layer, which should emit blue light therefrom (peak at 436 nm). When the blocking layer is omitted, holes can enter the electron transport layer to form excitons therein. Further, when the blocking layer is absent, excitons formed in the polymer layer can migrate to the electron transport layer, causing undesired light to be emitted in the electron transport layer with a characteristic emission color defined by the material of the electron transport layer (i.e., Alq). Without the BCP layer, peak emission at 524 nm (green) occurs in the electron transport layer of the device, thereby significantly detracting from the ability of the emissive dopants in the organic polymer layer to control the emission colors. However, with the BCP layer in place, peak emission occurs at 436 nm (blue), thereby indicating that emission has been confined to the organic polymer layer of the device, and that the dye of the polymer layer controls emission color.

A tabular comparison of rectification and operating efficiencies is presented in the table below for devices having of the structure: ITO anode/PVK:PBD:Emissive Dopant hole transport and emitting layer/BCP blocking layer/Alq electron transport layer/Mg:Ag cathode:

TABLE 1

| | | Blue (Bimane) | Green (Coumarin 6) | Red (Nile Red) |
|---|---|---|---|---|
| External Quantum Efficiency (%) | Single-layer | 0.13% | 0.70% | 0.61% |
| | Tri-layer | 0.34% | 1.1% | 0.95% |
| Rectification ratio @ +/− 10 V | Single-layer | 1.5e4 | 1.3e3 | 7.4e3 |
| | Tri-layer | 2.4e6 | 1.3e6 | 8.7e5 |

The rectification ratio of the tri-layer OLEDs (i.e., OLEDs containing polymer, blocking, and electron transport layers), defined as the ratio of forward current to reverse current at the same bias, is markedly improved over single-layer OLEDS (i e., OLEDs having only an organic polymer layer). For a bias of +/−10 V, the rectification ratio of the blue device is increased from 1.5e4 to 2.4e6. For the green device, an increase from 1.3e3 to 1.3e6 was observed. For the red device, an increase from 7.4e3 to 8.7e5 occurred. In addition to having higher rectification ratios, the tri-layer devices were observed to have higher efficiencies than single-layer devices.

Having thus described the invention in detail, it is to be understood that the foregoing description is not intended to limit the spirit and scope thereof. What is desired to be protected by Letters Patent is set forth in the appended claims.

What is claimed is:

1. A method of fabricating a display comprising an array of OLED structures comprising:

preparing a substrate coated with an anode layer;

depositing a polymeric host layer over the anode layer;

pattern depositing an stray of emissive dopants onto the polymeric host layer so as to produce an array of doped regions in the polymeric host layer;

depositing a blocking layer over polymeric boat layer;

depositing an electron transporting layer over the blocking layer; and depositing a cathode layer over the blocking layer;

wherein, the blocking layer comprises a small-molecule material and the electron transporting layer comprises a small-molecule material.

2. The method of claim 1, wherein the polymeric host layer comprises a hole transporting material.

3. The method of claim 1, wherein the doped regions produce emission in at least two different color regions of the visible spectrum.

4. The method of claim 1, wherein the doped regions produce emission in three different color regions cite visible spectrum.

5. The method of claim 1, wherein the polymeric host layer comprises PVK.

6. The method of claim 1, wherein the method further comprises depositing a polymeric hole injection layer over the anode layer and then depositing the polymeric host layer over the hole injection layer.

7. The method of claim 6, wherein the hole injection layer comprises PEDOT:PSS.

8. The method of claim 6, wherein the hole injection layer comprises PANI.

9. The method of claim 1, wherein the pattern deposition step comprises an ink jet printing step.

10. The method of claim 1, wherein the pattern deposition step comprises locally doping the polymeric host layer by dye diffusion.

11. The method of claim 1, wherein the blocking layer is a hole blocking layer.

12. The method of claim 1, wherein the blocking layer is an exciton blocking layer.

13. The method of claim 1, wherein the blocking layer comprises BCP.

14. A method of fabricating a display comprising an array of OLED structures comprising:

preparing a substrate coated with an anode layer;

pattern depositing an array of emissive polymeric regions over the anode layer;

depositing a blocking layer over the array of emissive polymer regions;

depositing an electron transporting layer over the blocking layer; and depositing a cathode layer over the electron transporting layer;

wherein the blocking layer comprises a small-molecule material and the electron transporting layer comprises small-molecule material.

15. The method of claim 14, wherein the emissive polymeric regions comprise a host polymer and an emissive dopant.

16. The method of claim 14, wherein the emissive polymeric regions produce emission in at least two different color regions of the visible spectrum.

17. The method of claim 14, wherein the emissive polymeric regions produce emission in three different color regions of the visible spectrum.

18. The method of claim 14, wherein the emissive polymeric regions comprise PVK.

19. The method of claim 14, wherein the method further comprises depositing a polymeric hole injection layer over the anode layer and then depositing the polymeric emissive regions over the hole injection layer.

20. The method of claim 19, wherein the hole injection layer comprises PEDOT:PSS.

21. The method of claim 19, wherein the hole injection layer comprises PANI.

22. The method of claim 14, wherein the pattern deposition step comprises an ink jet printing step.

23. The method of claim 14, wherein the pattern deposition step comprises a laser induced thermal imaging step.

24. The method of claim 14, wherein the blocking layer is a hole blocking layer.

25. The method of claim 14, wherein the blocking layer is an exciton blocking layer.

26. The method of claim 14, wherein the blocking layer comprises BCP.

27. A method of fabricating a display comprising an array of OLED structures comprising:

preparing a substrate coated with an anode layer;

depositing a polymeric host layer over the anode layer;

pattern depositing an array of emissive dopants onto the polymeric host layer so as to produce an array of doped regions in the polymeric host layer;

depositing a blocking layer over polymeric host layer and depositing a cathode layer over the blocking layer;

wherein, the blocking layer comprises a small molecule material and the blocking layer is electron transporting.

28. The method of claim 27, wherein the method further comprises depositing a polymeric hole injection layer over the anode layer and then depositing the polymeric boat layer over the hole injection layer.

29. A method of fabricating a display comprising an any of OLED structures comprising:

preparing a substrate coated with an anode layer;

pattern depositing an any of emissive polymeric regions over the anode layer;

depositing a blocking layer over the any of emissive polymer regions; and depositing a cathode layer over the blocking layer;

wherein the blocking layer comprises a small molecule material and the blocking layer is electron transporting.

30. The method of claim 29, wherein the method flintier comprises depositing a polymeric hole injection layer over the anode layer and then pattern depositing the array of emissive polymeric regions over the hole injection layer.

* * * * *

UNITED STATES PATENT AND TRADEMARK OFFICE
CERTIFICATE OF CORRECTION

PATENT NO. : 6,784,016 B2
DATED : August 31, 2004
INVENTOR(S) : Ke Long et al.

It is certified that error appears in the above-identified patent and that said Letters Patent is hereby corrected as shown below:

Title page,
Item [56], References Cited, OTHER PUBLICATIONS,
"T.-F. Guo, et al.," reference, change "ligh-emitting" to -- light-emitting --.

Column 12,
Line 1, change "stray" to -- array --;
Line 4, change "boat" to -- host --;
Line 17, change "cite" to -- of the --;

Column 14,
Line 5, change "boat" to -- host --;
Line 7, change "an any" to -- an array --;
Line 15, change "the any" to -- the array --; and
Line 20, change "flintier" to -- further --.

Signed and Sealed this

First Day of February, 2005

JON W. DUDAS
*Director of the United States Patent and Trademark Office*